United States Patent [19]

Gaule et al.

[11] 4,155,016

[45] May 15, 1979

[54] SHARPENING HIGH POWER PULSES

[75] Inventors: Gerhart K. Gaule, Elberon; Sol Schneider, Little Silver; Stephen Levy, Ocean, all of N.J.; Paul R. Laplante, Falls Church, Va.

[73] Assignee: The United States of America as represented by the Secretary of the Army, Washington, D.C.

[21] Appl. No.: 849,565

[22] Filed: Nov. 8, 1977

[51] Int. Cl.$^2$ .................. H03K 5/12; H03K 5/08; H03K 6/04

[52] U.S. Cl. .................................... 307/268; 307/263

[58] Field of Search ............... 307/256, 268, 263, 363; 361/6, 110, 111, 117, 118, 126, 127

[56] References Cited

U.S. PATENT DOCUMENTS

| | | | |
|---|---|---|---|
| 3,385,982 | 5/1968 | Raillard et al. | 307/268 X |
| 3,509,351 | 4/1970 | Stuckert | 307/268 X |
| 3,644,747 | 2/1972 | Gray | 307/268 X |
| 3,686,516 | 8/1972 | Guadagnolo | 307/263 |
| 3,849,732 | 11/1974 | Pezot | 307/263 X |
| 3,962,715 | 6/1976 | Raccah et al. | 357/61 X |
| 3,973,224 | 8/1976 | Gaule et al. | 361/111 X |

OTHER PUBLICATIONS

Gaule et al., *IEEE Int'l Pulse Power Conference*; 11/1976.

Gaule et al., 1976 *IEDM Technical Digest*, pp. 279–282; 12/1976.

*Primary Examiner*—Larry N. Anagnos
*Attorney, Agent, or Firm*—Nathan Edelberg; Sheldon Kanars; Bernard Franz

[57] ABSTRACT

A metal oxide threshold switch (MOTS, e.g., $NbO_x$, x preferably fractionally less than 2) series connected is used to sharpen the pulse rise to about one or less nanosecond, with a peak up to several kilovolts, and up to 100 amperes or more.

3 Claims, 4 Drawing Figures

FIG. 1
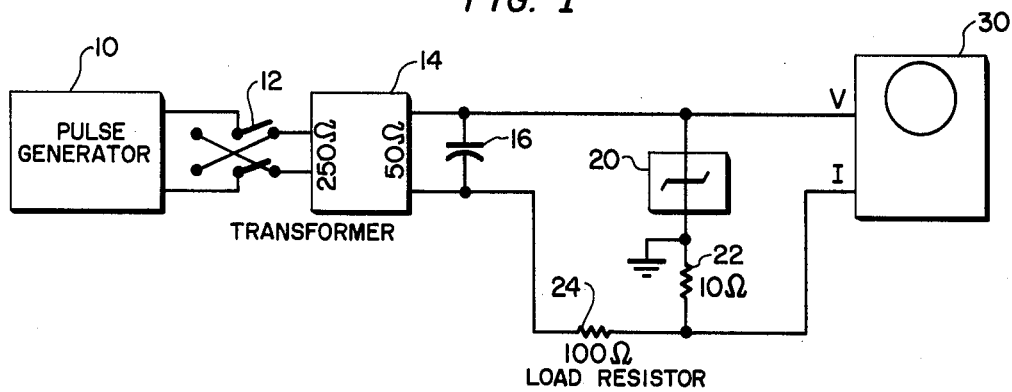
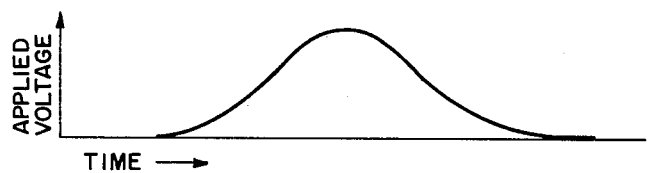
FIG. 2A
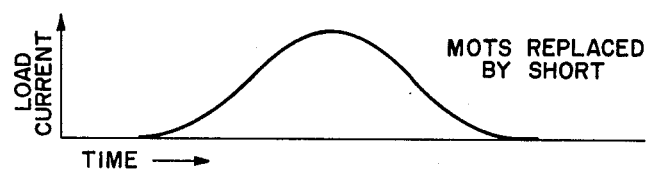
FIG. 2B
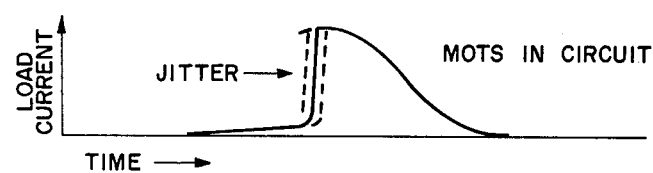
FIG. 2C

SHARPENING HIGH POWER PULSES

The invention described herein may be manufactured and used by or for the Government for governmental purposes without the payment of any royalties thereon or therefor.

BACKGROUND OF THE INVENTION

This invention relates to sharpening the rise time of high voltage, high current pulses.

The interest in nanosecond high voltage pulse generations is rapidly increasing. At the present time, they are used in quantum physics, in nuclear physics, in particle accelerators, in x-ray generators, in high-speed photography, etc. The possibility of applying nanosecond generators to solve certain problems in experimental physics such as the production of powerful pulse lasers, strong-current accelerators of charged particles, and fast heating of plasma is of extreme interest. These pulses are also of interest for radar. The state of the art is covered by a book "Formation of Nanosecond Pulses of High Voltage" by G. A. Mesyats, A. S. Nasibor and V. V. Kremnev, translation available from National Technical Information Service, Springfield, VA. 22151, as document No. AD 733 130.

A conventional (silicon) solid state device in a pulse-sharpening circuit would, because of its 100 to 1000 picofarad capacitance, cause intolerable pre-switching currents. Pulse-sharpening with gaseous devices is unsatisfactory because of the long and uncertain switch-on delay (several nanoseconds) with these devices. Therefore pulses from conventional power sources for lasars and radars are not sharpened—they have a much longer than optimal risetime.

SUMMARY OF THE INVENTION

The object of the invention is to provide shorter rise-times with more time precision (less jitter), while at the same time reducing complexity, cost and size of a pulser circuit.

According to the invention, a metal oxide threshold switch (MOTS) is connected in series between a pulse generator and a load.

One type of MOTS uses NbOx (x equal to or preferably fractionally less than 2) as the switching material, either as a thin film formed on NbO, or in bulk form. The threshold voltage may be from about 60 volts up to several kilovolts, with a current in the "ON" state of several amperes or more than 100 amperes. The "OFF" state capacitance is only a few picofarads, and the switching time less than a nanosecond.

BRIEF DESCRIPTION OF THE DRAWING

FIG. 1 is a block and schematic drawing of an embodiment of the invention; and

FIGS. 2A, 2B and 2C are graphs of voltage and current waveforms.

DETAILED DESCRIPTION

Further information on the operation of metal oxide threshold switches and some applications is found in two papers by G. Gaule', P. LaPlante, S. Levy and S. Schneider; the first titled *Pulse Sharpening with Metal-Oxide Bulk Switching Devices* in IEEE International Pulse Power Conference, November 1976; and the second titled *Metal Oxide Devices for Rapid High Current Switching* in the 1976 IEDM Technical Digest, pages 279-282, published December 1976. These papers are made a part hereof. They include a disclosure of the invention claimed herein.

Metal oxide threshold switches, MOTS, have been used to suppress transient pulses such as induced by lightening, etc. See, for example, U.S. Pat. No. 3,973,224. When applied in that manner, the device is placed in shunt across a transmission line to absorb the transient pulse current, and thereby protect a load device at the end of the line.

When a metal oxide threshold switch is subjected to a fast rising pulse from a low impedance source, it goes from a high impedance state (characterized by typically 100 kilohms to one megaohm in parallel with 1 to 4 picofarads) to a low impedance within less than a nanosecond. The voltage then appears clamped to the threshold value, and subsequently drops to a "holding voltage" of typically 20 volts. After termination of the applied pulse, the high impedance state, and the previous threshold voltage value is essentially recovered within typically 6 microseconds.

One form of the metal-oxide (MOX) chip is a NbO (a semiconductor, acting as ohmic contact) crystal with a 10 micrometer NbOx layer thermally grown on top by oxidation. (See U.S. Pat. No. 3,962,715.) The stoichiometric value of x is 2, but values lower than that, for example, x equal to about 1.9 have been found preferable for switching material. The thin film form yields threshold voltages from 80 to 600 volts. For higher voltages, single crystal chips of NbOx are used. Threshold voltages are controlled by the thickness of di-oxide and also the deviation from stoichiometry. The current flow in the low impedance state is typically several amperes, and values of 250 amperes have been sustained.

Referring now to FIG. 1, the basic circuit comprises a pulse generator 10 supplying pulses to a load represented by a 100-ohm resistor 24. To sharpen the pulses, a metal oxide threshold switch device 20, for example a NbOx device, is connected in series between the source and the load.

In an experimental arrangement, a Cober pulse generator 10, type 605-P, was set to produce a slow rising pulse (100 nanoseconds). The reversing switch 12, transformer 14, and 1500-picofarad capacitor 16 may be included as a part of the pulse source. To observe the results an oscilloscope, type Tektronix 7904 and a 10-ohm resistor 22 are connected as shown.

The applied voltage from the pulse source is shown in FIG. 2A. The effectiveness of pulse sharpening is tested by replacing the MOTS device 20 with a short. In that case, the shape of the current pulse resembles that of the applied voltage (FIG. 2B). Insertion of the MOTS device 20 causes sharpening of the current pulse, as shown in FIG. 2C. The current rise time is thus reduced to a few nanoseconds. During repetitive pulsing there is some variation in the time of the onset of the sharp rise of the current (jitter). However this "time jitter" can be quite small compared to that obtained with prior high voltage, high current switching devices.

What is claimed is:

1. Pulse sharpening means for a circuit in which a pulse source supplies high voltage, high current pulses to a load; the pulse sharpening means comprising a metal oxide threshold switch device connected in series between the pulse source and the load, to thereby limit the current flow to the load to a very small leakage value until a threshold voltage value is reached to switch said device from a high impedance to a low impedance state, with a fast rise time of the current pulse to a high value, the voltage across said device dropping to a low holding value; and said device returning to the high impedance state responsive to the voltage across it becoming less than the holding value as the pulse from the pulse source terminates.

2. Pulse sharpening means according to claim 1, wherein the metal oxide of said device is $NbO_x$, the value of x being in the range from approximately 2 extending downward into non-stoichiometric values.

3. Pulse sharpening means according to claim 2, wherein the threshold voltage is in the range from approximately 60 volts to several kilovolts, and the current flow in the low impedance state is in the range from several amperes to hundreds of amperes.

* * * * *